United States Patent [19]
MacLeish et al.

[11] Patent Number: 5,891,251
[45] Date of Patent: Apr. 6, 1999

[54] CVD REACTOR HAVING HEATED PROCESS CHAMBER WITHIN ISOLATION CHAMBER

[76] Inventors: Joseph H. MacLeish, 2529 Wild Horse Dr., San Ramon, Calif. 94523; Robert D. Mailho, 14338 Kirk Alan La., Sonora, Calif. 95370

[21] Appl. No.: 694,001

[22] Filed: Aug. 7, 1996

[51] Int. Cl.$^6$ .................................................. C23C 16/00
[52] U.S. Cl. .......................... 118/719; 118/725; 118/728
[58] Field of Search .................................. 118/719, 725, 118/728

[56] References Cited

U.S. PATENT DOCUMENTS

| | | | |
|---|---|---|---|
| 5,088,444 | 2/1992 | Ohmine | 118/719 |
| 5,232,508 | 8/1993 | Arena | 118/719 |
| 5,242,501 | 9/1993 | McDiarmid | 118/728 |
| 5,244,500 | 9/1993 | Ebata | 118/725 |
| 5,370,738 | 12/1994 | Watanabe | 118/725 |
| 5,421,890 | 6/1995 | Kita | 118/719 |

*Primary Examiner*—Richard Bueker
*Attorney, Agent, or Firm*—Skjerven, Morrill, MacPherson, Franklin & Friel LLP; Alan H. MacPherson

[57] ABSTRACT

A CVD reactor includes separate reaction and pressure chambers, where the reaction chamber is contained within and isolates process gases from the pressure chamber. In this manner, each of the chambers may be designed specifically for its intended purpose. The pressure chamber is of a bell-jar shaped designed to sustain a low-pressure environment. The reaction chamber is of a parallel-plate shaped designed for optimized process gas flow. The reaction chamber is isolated from the pressure chamber such that process gases present in the reaction chamber are separated from and cannot come into contact with the inner surface of the bell jar. In this manner, process gases do not deposit on the walls of the pressure chamber. In one embodiment, the wafer is heated by induction coils external to the process chamber. In this manner, the heat transferred to the wafer is not dependent upon the thickness of deposition layers formed on the walls of the reaction chamber.

13 Claims, 9 Drawing Sheets

CVD REACTOR HAVING HEATED PROCESS CHAMBER WITHIN ISOLATION CHAMBER

CROSS-REFERENCE TO RELATED APPLICATIONS

This application relates to commonly owned U.S. patent application Ser. No. 08/876,967 entitled "GAS INJECTION SYSTEM FOR CVD REACTORS," filed on Jun. 16, 1997, and bearing attorney docket No. M-4342-1P, which is a continuation-in-part of U.S. Pat. No. 5,653,808, filed on Aug. 7, 1996, and bearing attorney docket No. M-4342 US.

BACKGROUND

1. Field of the Invention

The present invention relates to a Chemical Vapor Deposition (CVD) process chamber and, specifically, to a single wafer, multi-chamber CVD system.

2. Description of Related Art

A continuing challenge in the fabrication of integrated circuits is to maintain a wafer at a constant and uniform temperature so that various layers (i.e., epitaxial layers, polysilicon layers, etc.) of a uniform thickness and resistivity may be deposited thereon. In a typical radiantly heated "warm" wall CVD reactor, a wafer is placed in a quartz containment vessel. As the vessel and the wafer therein are heated by lamps positioned external to the vessel, reactant gases are pumped into the vessel so as to deposit on the wafer.

"Warm" wall CVD reactors such as the one described above have a number of limitations which adversely affect efficiency, reliability, and performance. For single wafer CVD systems, including those tailored to deposit epitaxial and polysilicon layers, throughput is an important consideration. Perhaps the biggest obstacle in improving throughput in such CVD systems is the time required to clean the chamber walls after each wafer is processed. Cleaning the chamber walls in radiantly heated quartz CVD chambers is vital since reactant gases deposit not only on the wafer but also on the chamber walls. The resultant film formed on the chamber walls absorbs some of the radiant energy emitted from the heating lamps and thereby locally increases the temperature of the chamber walls. As a result, reactant gases deposit on the chamber walls at an increasing rate, thereby creating a "snowball" effect. It is therefore critical, in a radiantly heated CVD chamber, that the walls be kept meticulously clean. This requires that the walls be etched frequently, sometimes even after every run. Cleaning the walls typically takes between 2 to 3.5 minutes after depositing an epitaxial layer, and up to one hour after depositing polysilicon. Such long cleaning times result from the relatively slow etchant rates associated with the warm walls of the chamber (which are designed to transmit heat). Since the entire cycle time in warm wall CVD systems may be between 5–10 minutes, cleaning the walls accounts for a significant portion of the cycle time.

Another factor affecting the throughput of such CVD chambers is the deposition rate of the reactant gases. Chambers that are optimized for deposition rates can decrease the deposition time required for a single wafer by as much as 25%.

Additionally, lamp failure (and the maintenance related thereto) and a required wet etching of the quartz chamber walls of such CVD systems adversely affects reliability and uptime. Note that wet etching requires disassembling the CVD system so that the quartz walls may be submerged in a wet etch bath.

Temperature control of the wafer is imperative for the deposition of uniform layers. The above described deposition of reactant gases on the chamber walls of lamp heated systems can occur within a single run and may affect the temperature uniformity within a run. Thus, cleaning the chamber walls after each wafer run may be ineffective in preventing non-uniformities resulting from deposition of reactant gases on the chamber walls.

Achieving a constant and uniform temperature across a wafer is further complicated by variations in the emissivity of the wafer. Since a wafer's emissivity depends in part upon the surface material of the wafer and upon temperature, accurately calibrating a reactor so as to bring the wafer to a constant and uniform temperature may be difficult.

An optimum CVD system should be able to operate at both atmospheric and reduced pressures. Reduced pressure operation requires a chamber design able to withstand the physical stresses of a lower pressure processing environment, i.e., a vacuum chamber. On the other hand, optimum designs for wafer processing may require a reactant gas flow channel having a narrow profile. This narrow profile optimizes reactant gas flow to the wafer by facilitating a maximum velocity flow of reactant gas across the wafer while minimizing the mass transfer boundary layer. In addition to having a narrow profile, chambers designed for optimum processing typically have simple non-convoluted surfaces so as to minimize vortices and backflow, to minimize dead spots that may promote deposition on the chamber walls, and to allow etching gases employed to clean the chamber walls to quickly reach the chamber walls. Unfortunately, such flat topped quartz or graphite process chambers cannot easily sustain a pressure gradient across their walls. Chambers capable of withstanding such pressure differences typically are either of a fuller shape, such as a bell or globe structure, and therefore not only compromise optimum gas flow across the surface of the wafer but also do not facilitate an efficient cleaning of the chamber walls. Another approach is to incorporate structural reinforcement elements on the chamber walls. Unfortunately, such elements hamper the uniform transmission of radiant energy to the wafer. As a result, single chamber CVD designs suitable for reduced pressure operation typically compromise processing considerations such as reactant gas flow or thermal uniformity in order to increase structural integrity.

SUMMARY

A CVD reactor is disclosed herein which overcomes problems in the art discussed above. In accordance with the present invention, a CVD reactor includes a reaction chamber contained within a pressure vessel, where the pressure vessel and the reaction chamber are designed specifically for their intended purposes. The pressure vessel is in one embodiment bell-jar shaped to sustain a pressure gradient across its walls, and the pressure within the reaction chamber equalizes with the pressure within by the pressure vessel. The reaction chamber houses a wafer to be processed therein and is contained entirely within the pressure vessel and, thus, does not have to be designed to withstand pressure forces across its walls. Accordingly, the reaction chamber is designed exclusively for optimized process gas flow, as well as cleaning and etching gas flow, within the reaction chamber. In some embodiments, the reaction chamber is of a parallel-plate shape such that the dimension of the reaction chamber perpendicular to the surface of the wafer is of a minimal height. The reaction chamber is substantially isolated from the pressure vessel such that reactant gases present within the reaction chamber are precluded from contacting the walls of the pressure vessel. In one embodiment, this isolation is achieved by maintaining a gas pressure in the volume between the pressure vessel and the reaction chamber slightly above the pressure of the gases in the reaction chamber. The gas in the volume is selected so as not to deposit on or react with the pressure vessel walls. In this manner, reactant gases are prevented from depositing on the walls of the pressure chamber.

In some embodiments, the reaction chamber approximates a black-body cavity encapsulating the wafer, thereby allowing the temperature of the wafer to be determined by measuring the temperature of the walls of the reaction chamber.

In some embodiments, the reaction chamber is heated by RF (radio frequency) induction coils positioned on the external periphery of the pressure vessel. The RF energy produced by the coils passes through the quartz walls of the pressure vessel to a graphite heating element (reaction chamber) which thereby heats the wafer. This RF energy passes through the quartz walls even in those embodiments in which a thin silicon layer is formed on the walls of the reaction chamber. Thus, heat transferred to the wafer is not dependent upon the thickness of deposited layers formed on the walls of the reaction chamber.

DETAILED DESCRIPTION

The operation of embodiments of the present invention will be discussed below in the context of the deposition of an epitaxial layer on a wafer. It is to be understood, however, that embodiments in accordance with the present invention may be used to deposit any suitable material on a wafer while still realizing the advantages of the present invention.

Figure 1:
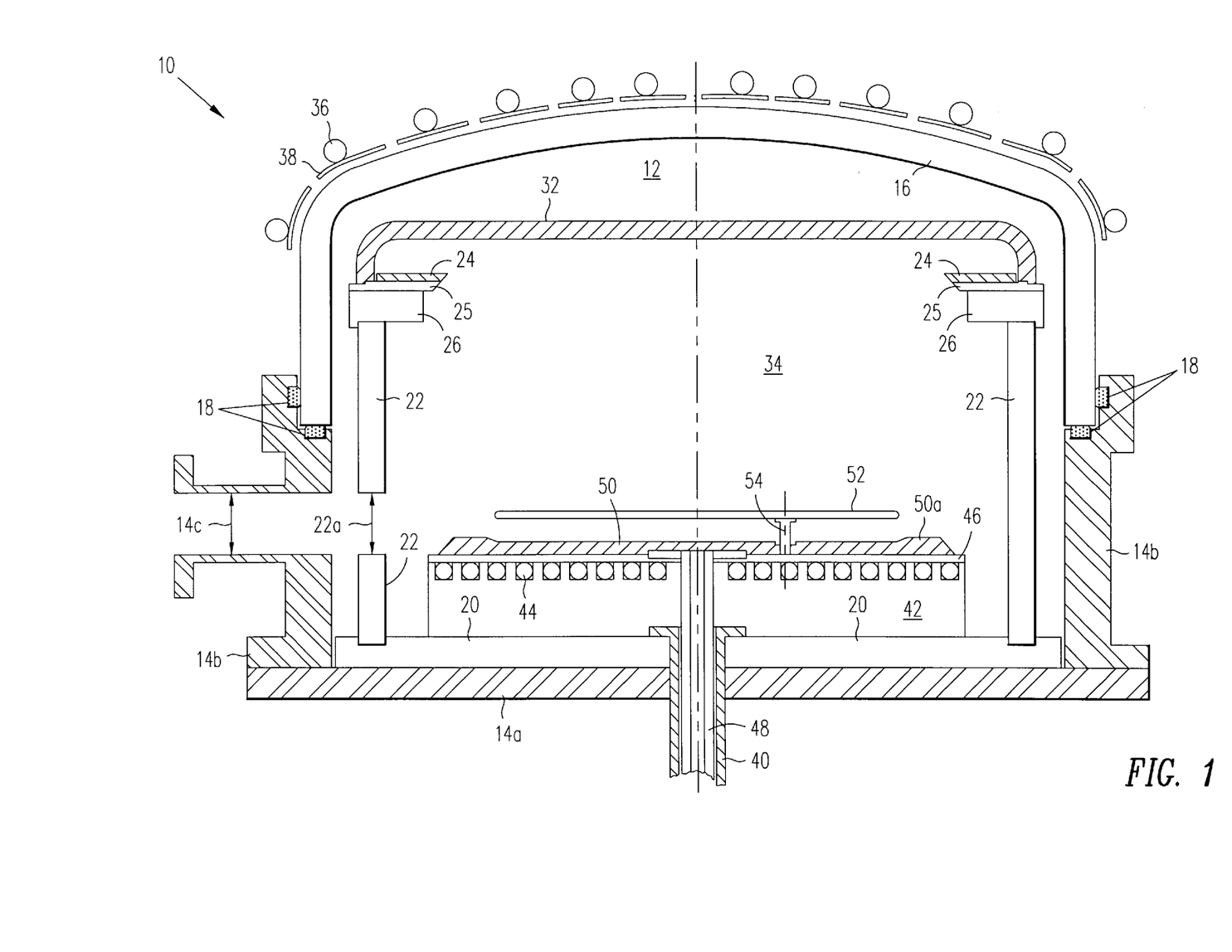
FIG. 1 is a cross-sectional view of a CVD reactor in accordance with one embodiment of the present invention, where the susceptor is in a lowered position to allow for loading of the wafer.
Figure 2:
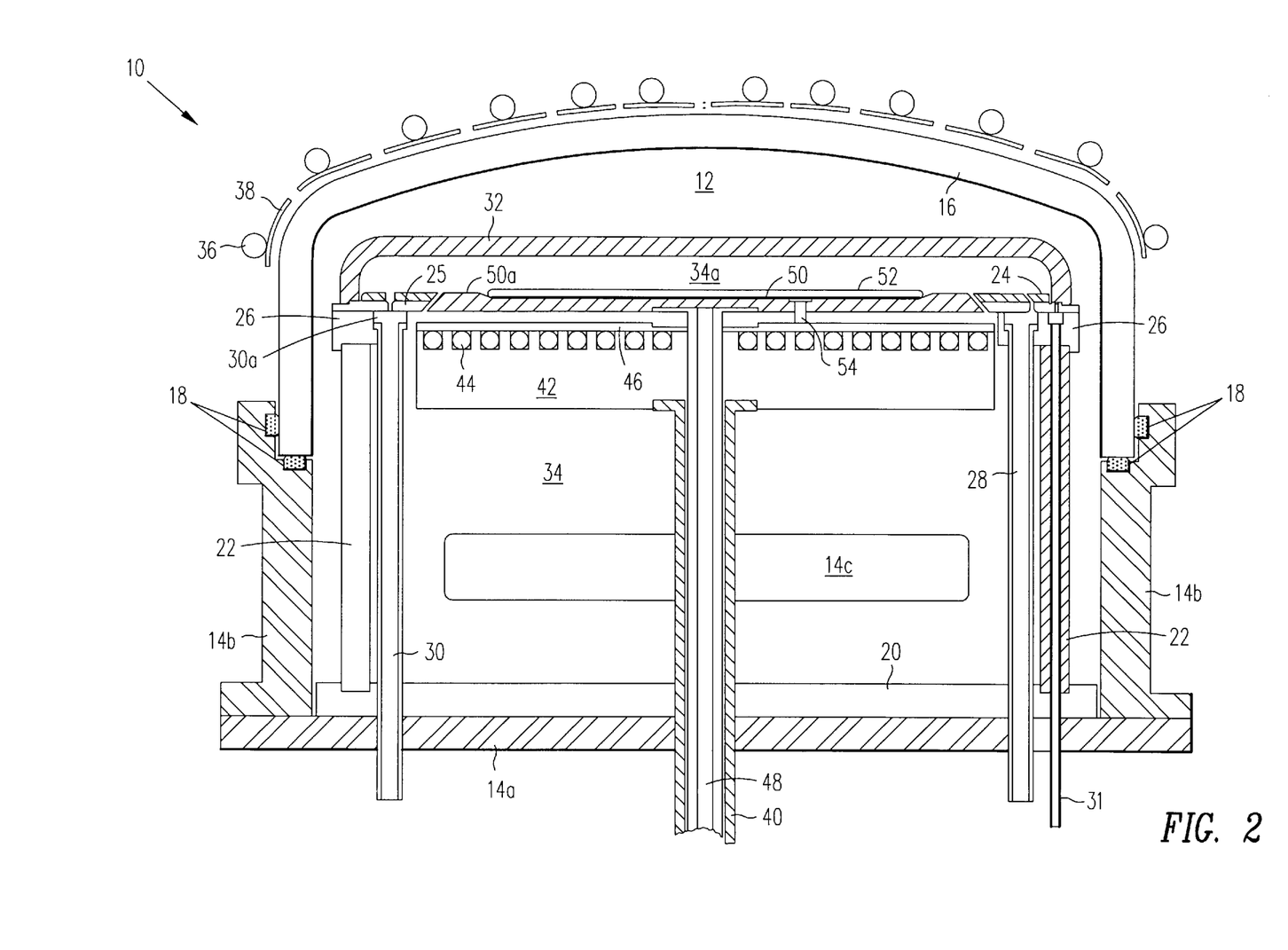
FIG. 2 is a cross-sectional view of the CVD reactor of FIG. 1 taken from a perspective perpendicular to that of FIG. 1, where the susceptor is in a raised position to allow for processing of the wafer.

Referring now to FIGS. 1 and 2, where common parts are denoted with the same numerals, a chemical vapor deposition (CVD) reactor 10 includes a pressure vessel comprised of a bell jar 16 and a stainless steel cylindrical outer housing 14 having a base plate 14a and a side wall 14b. Bell jar 16 is preferably opaque quartz and is removably attached to outer housing 14. Side wall 14b is securely attached to base plate 14a and is attached to and pressure sealed with bell jar 16 via O-rings 18. A quartz plate 20 is mounted onto base plate 14a. The pressure vessel formed by elements 14 and 16 encloses volumes 12 and 34 which can be at a reduced pressure.

A cylindrical inner housing 22 preferably constructed of opaque quartz is positioned within the pressure vessel formed by elements 14, 16 and mounted onto quartz plate 20. A first ring plate 24 preferably made of silicon carbide overlies a second ring plate 25 made of quartz which is mounted onto a spacer ring 26 which, in turn, is mounted onto inner housing 22, as shown in FIG. 1. Ring plates 24, 25 and spacer ring 26 each have one or more aligned openings through which one or more associated injection ducts 28 and exhaust ducts 30 pass (only one injection duct 28 and one exhaust duct 30 are shown in FIG. 2 for simplicity). Additional aligned openings are formed in ring plates 24, 25 and spacer ring 26 through which one or more associated injection ducts 31 pass. A dish 32 is mounted onto the upper surface of second ring plate 25. Dish 32, which is preferably graphite and has a coating of silicon carbide provided on the outer surface thereof, is in intimate contact with second ring plate 25. In FIG. 1, aligned openings 14c and 22a formed respectively in outer housing 14 and inner housing 22 allow a mechanical robot arm of well known design (not shown for simplicity) to insert and remove a wafer to and from the interior of reactor 10. A valve (not shown) is provided within opening 14c to isolate the inside of reactor 10 from the environment external to reactor 10.

A plurality of water-cooled, copper induction coils 36 are provided on an outside surface of bell jar 16. The turns of coils 36 may be electrically isolated from one another by non-conductive separators (not shown) such as, for example, quartz or ceramic or any appropriate material or combination of materials having the desired electrical properties. In this manner, coils 36 do not interact with one another. This also minimizes the tendency to arc or form plasmas. Diffusion plates 38 support copper coils 36 and also shape the RF field generated by copper coils 36 and result in a more uniform heating of reactor 10. In the preferred embodiments, induction coils 36 are grouped into three independently controlled concentric heating zones to allow for the uniform heating of a wafer. Of course, a different number of controlled heating zones may be employed if so desired. The temperature of the exterior of copper coils 36 should be kept below the melting point of copper coils 36.

A longitudinal tube 40 preferably made of quartz has an upper end coupled to a circular quartz housing 42 having a plurality of induction coils 44 therein and has a lower end operatively coupled in a conventional manner to a first electrically controllable drive motor (not shown) which raises and lowers tube 40 and housing 42. In some embodiments, coils 44 are similar in construction to coils 36. Preferably, coils 44 are grouped in three independently controllable concentric heating zones, although a different number of controllable heating zones may be used if desired, and are electrically isolated from one another in a manner similar to that described above with respect to coils 36. A silicon carbide layer 46 provided on the top surface of housing 42 serves as a heat conductor between coils 44 and a circular graphite susceptor 50.

Positioned within tube 40 is a rotatable quartz longitudinal shaft 48 having an upper end coupled to susceptor 50 upon which a wafer 52 to be processed rests. The lower end of shaft 48 is operatively coupled in a conventional manner to a second electrically controllable drive motor (not shown) which allows for susceptor 50, and thus wafer 52, to be raised, lowered, and rotated. Concentric tube 40 and shaft 48 pass through housing 42 via a circular opening at the center thereof.

Figure 3A:
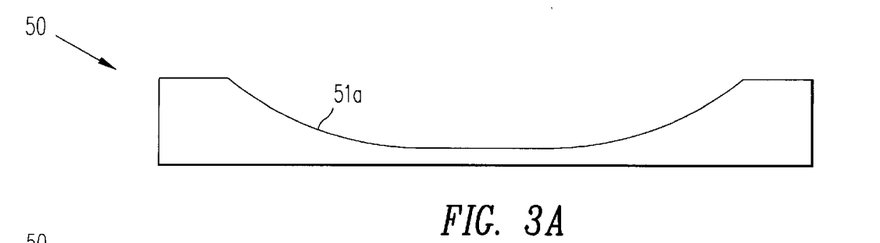
FIGS. 3A and 3B are cross-sectional views of wafer susceptors in accordance with embodiments of the present invention.
Figure 3B:
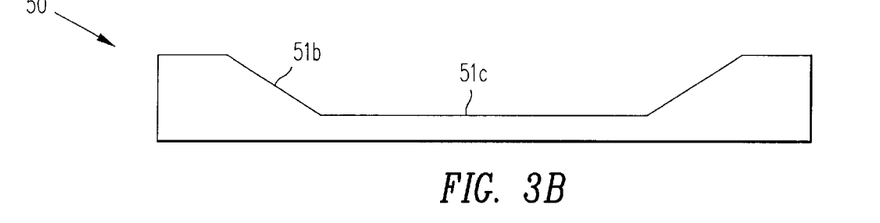

A portion of the top surface of susceptor 50 is recessed such that a minimum number of points along the outer edge of wafer 52 need be in intimate contact with susceptor 50 while wafer 52 rests thereon, thereby minimizing conductive heat transfer between susceptor 50 and wafer 52. In some embodiments, susceptor 50 has a dish-shaped cavity 51a formed therein, as shown in FIG. 3A, while in other embodiments the recessed portion of susceptor 50 preferably has an angled wall 51b sloping down to a linear recessed surface 51c, as shown in FIG. 3B. The susceptor 50 shown in FIG. 3B is preferred since linear surface 51c allows for a more uniform spacing between susceptor 50 and a wafer than does the dish-shaped cavity 51a of susceptor 50 shown in FIG. 3A.

When resting on susceptor 50 as shown in FIG. 2, the bottom surface of wafer 52 is approximately 3–5 mils above the top surface of susceptor 50. The top surface of wafer 52 should be substantially flush with the top surface of the outer lip 50a of susceptor 50. For example, in some embodiments the top surface of wafer 52 can be within ±80 mils of the top surface of outer lip 50a of susceptor 50 and can be considered substantially flush. Susceptor 50 has three openings formed therein through which three quartz or silicon carbide pins 54 protrude so as to, when desired, lift wafer 52 off susceptor 50 (only one of pins 54 is shown in FIG. 1 and 2 for simplicity).

Wafer 52 is loaded onto pins 54 via a mechanical robot (not shown) through openings 14c and 22a in FIG. 1. The first motor is operated to raise housing 42, which in turn raises shaft 48 and susceptor 50, to an elevated position. As housing 42 is raised toward the top of chamber 34, i.e. toward dish 36, the second motor is activated and elevates susceptor 50 away from housing 42. Susceptor 50 gently lifts wafer 52 off pins 54 and cradles wafer 52 in its recessed portion as described earlier with respect to FIGS. 3A and 3B. In this manner, wafer 52, susceptor 50 and housing 42 are elevated into the processing position shown in FIG. 2.

The top surface of ring plate 24 and the top surface of lip 50a of susceptor 50 should be in substantially the same plane. While some deviation in this co-planarity might be expected, the goal is to make these two surfaces as closely as possible in the same plane. In this manner, dish 32, ring plate 24, susceptor 50 and wafer 52 form a parallel-plate shaped reaction chamber 34a that approximates a black body cavity and, thus, minimizes temperature gradients across wafer 52. Chamber 34a isolates the reactant gases used in processing wafer 52 from the pressure vessel while allowing pressure equalization between the pressure vessel and reaction chamber 34a.

Power is applied to induction coils 36 along the outer surface of bell jar 16 and to induction coils 44 disposed within housing 42 to heat wafer 52 to a desired temperature. The RF energy emitted from coils 36 couples to dish 32 and is controlled to create a uniform temperature across dish 32, thereby heating wafer 52 from above. In a similar manner, RF energy emitted by coils 44 in housing 42 couples with susceptor 50, thereby heating wafer 52 from below. In one embodiment, three infrared (IR) sensors arranged in a linear fashion about the periphery of bell jar 16 are employed to determine the temperature of portions of dish 32 immediately above wafer 52 through three associated clear quartz windows (not shown) in bell jar 16. Three sets of aligned quartz windows (not shown) may be formed in housing 42 and layer 46 so that additional IR sensors positioned below housing 42 may be employed to measure the temperature of portions of susceptor 50 immediately below wafer 52. Suitable IR sensors are commercially available from LAND Corporation of Bristol, Pennsylvania. Although IR sensors are preferred, other sensors may be employed herein without departing from the scope of the present invention.

Information indicative of temperature gradients across wafer 52 generated by the three IR sensors above wafer 52 is provided as feedback to a controller (not shown) which in response thereto adjusts the RF fields generated by each of the three independently controlled concentric zones of coils 36. In some embodiments, this controller may be a computer. In a similar manner, information indicative of temperature gradients across wafer 52 generated by the three IR sensors below wafer 52 is used by the controller (not shown) to adjust the RF fields generated by each of the three independently controlled zones of coils 44. In this manner, reactor 10 maintains wafer 52 at a controlled and uniform temperature. Note that in other embodiments, independently controllable concentric zones of coils 36 and coils 44 may be replaced by radiant energy sources, such as for instance conventional heat lamps.

Figure 4:
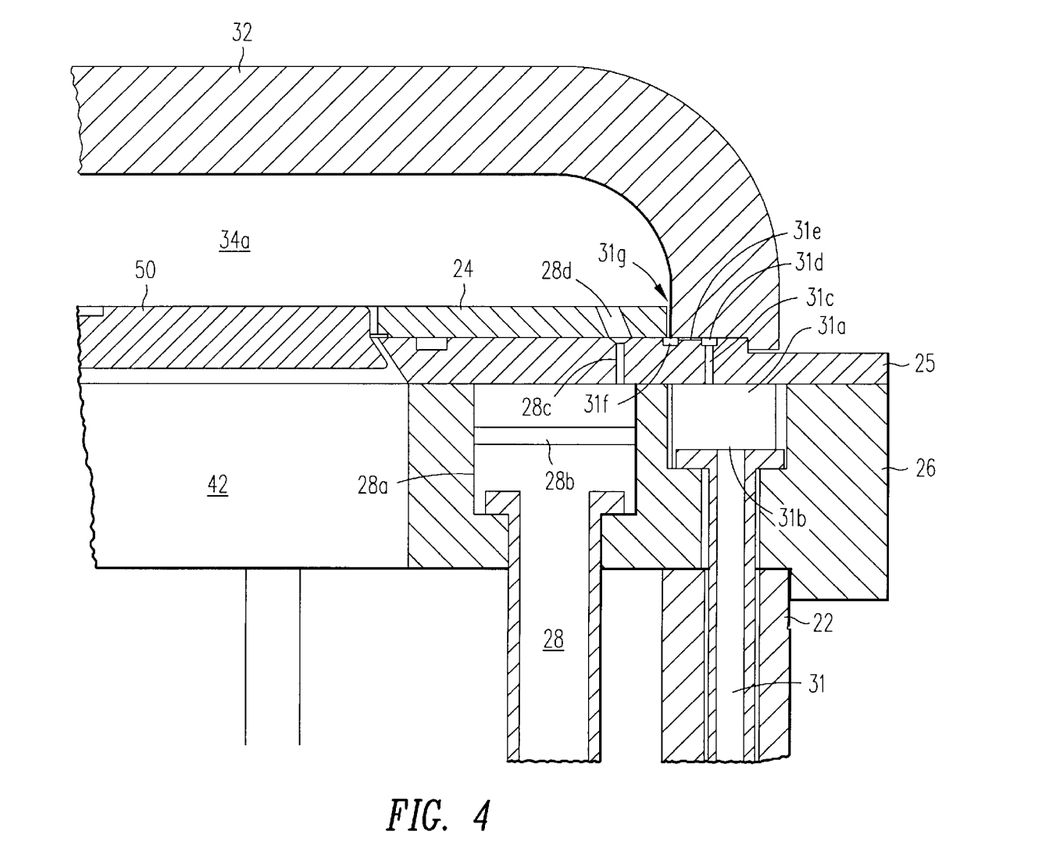
FIG. 4 is a cross-sectional view of a process gas injection system in accordance with the present invention.
Figure 5:
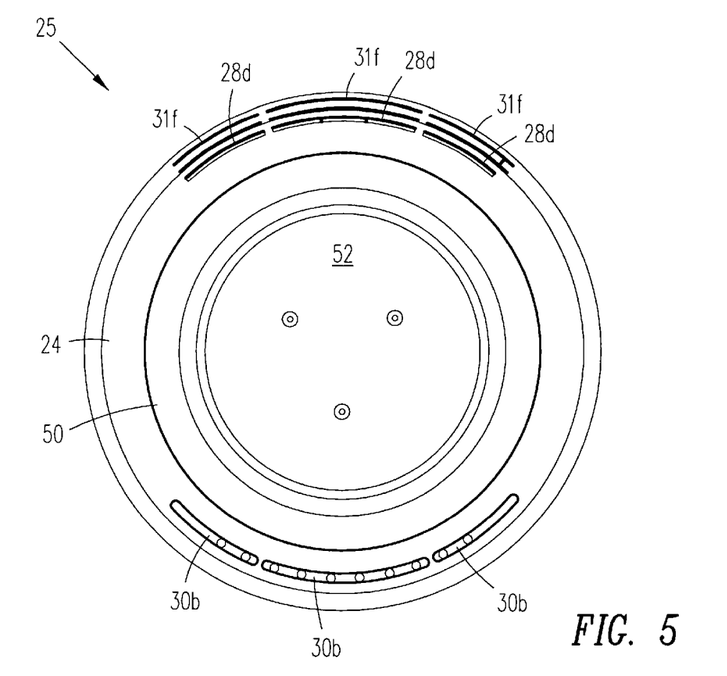
FIGS. 5 and 6 are top views of respective elements 25 and 26 of the reactor of FIGS. 1 and 2.
Figure 6:
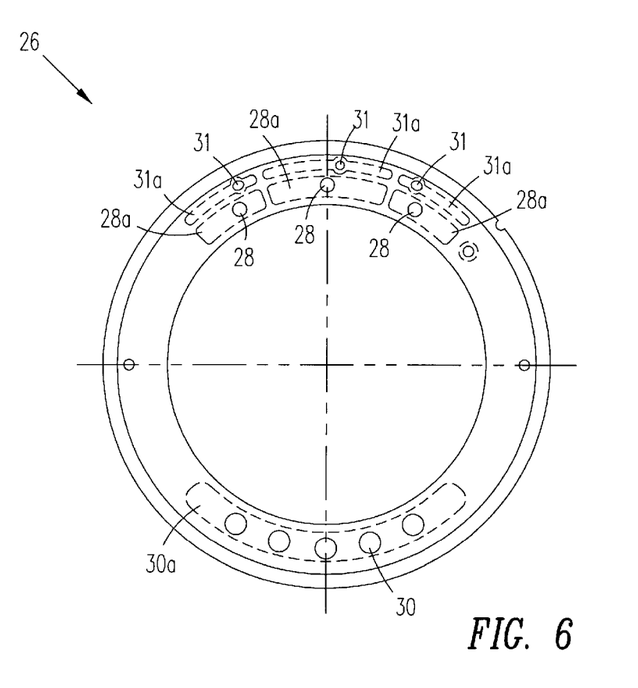

Process gases are fed into reaction chamber 34a via three injection ducts 28 (only one shown in FIG. 2 for simplicity). In other embodiments, reactor 10 may include a greater or fewer number of such injection ducts 28. Referring also to FIG. 4 which shows in detail that portion of one of injection ducts 28 lying within spacer ring 26 and to FIGS. 5 and 6 which show cross-sectional views of elements 25 and 26, respectively, each of injection ducts 28 is connected to an associated injection plenum 28a formed within spacer ring 26. A diffuser plate 28b having a multiplicity of holes (not shown) formed therein is positioned within plenum 28a. The size, number, and positioning of the holes within diffuser plate 28b may vary depending upon desired gas flow characteristics. High velocity process gases flowing in a vertical direction through duct 28 flow into plenum 28a. The process gases strike the bottom surface of diffuser plate 28b and are somewhat diffused as they flow through plenum 28a. After entering the upper portion of plenum 28a via the holes formed in diffuser plate 28b, the process gases pass through connected vertical slot 28c and angled slot 28d and flow into reaction chamber 34a at some predetermined angle which is chosen to maximize uniform deposition upon wafer 52. In some embodiments, slots 28c and 28d have a width of approximately 10 mils, while in other embodiments slots 28c and 28d may be replaced by a series of adjacent holes or other appropriate structure. Also note that, as shown in FIGS. 5 and 6, each of plenums 28a and associated slots 28c and 28d may be of differing dimensions as required by the particular process gas flow characteristics desired. In all of the present embodiments, the goal is for the above-described series of holes and slots to create sufficient back pressure so that the process gases forced into reaction chamber 34a have an even, lateral distribution.

Figure 7:
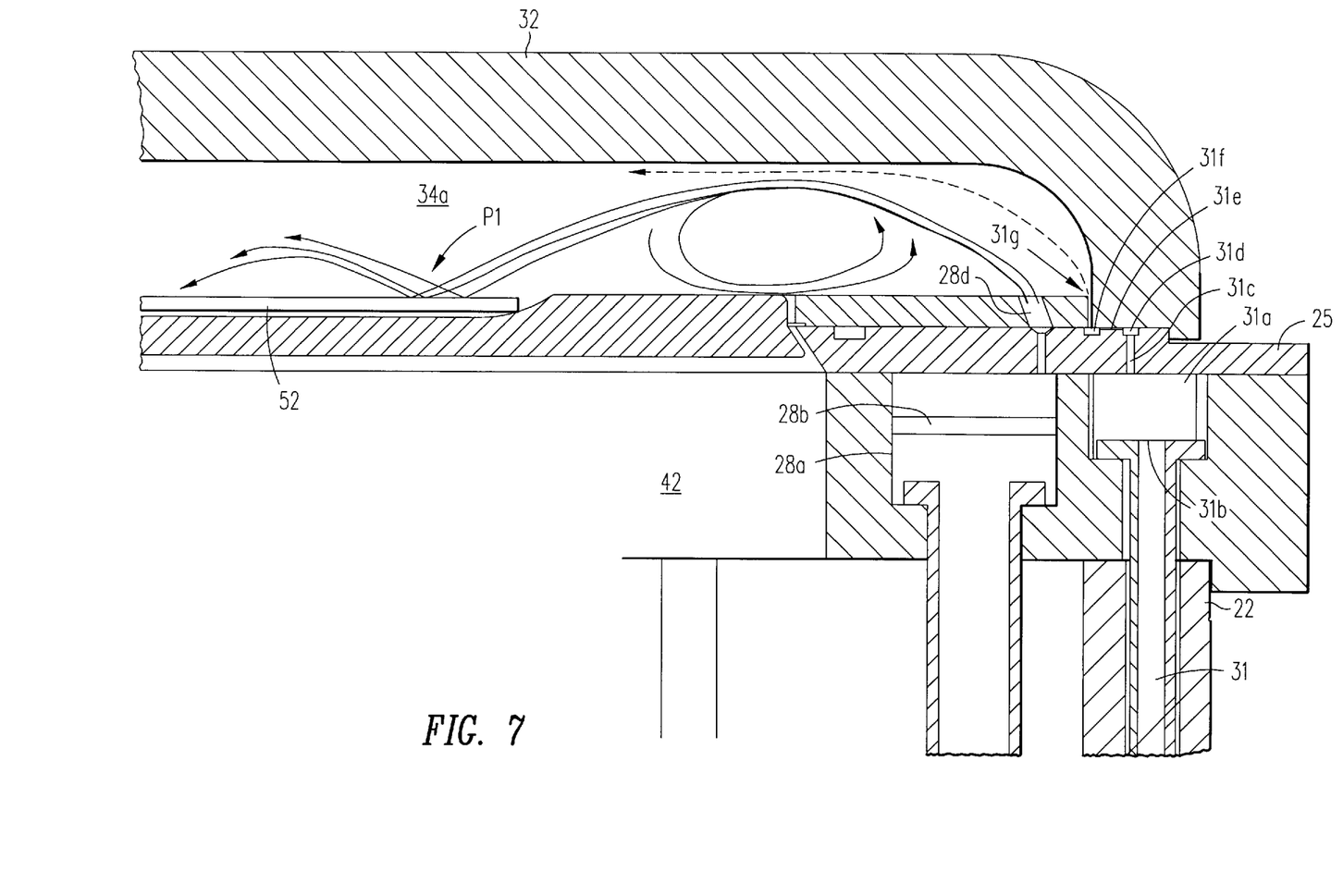
FIG. 7 is a cross-sectional view of reactor 10 illustrating gas flow patterns characteristic thereof.

During processing of wafer 52, hydrogen or any appropriate gas is pumped into reaction chamber 34a via three injection ducts 31 (only one shown for simplicity) lying within associated bore holes formed in housing 22 as shown in FIG. 7. Each of ducts 31 is connected to an associated plenum 31a via a hole 31b formed within a bottom surface of plenum 31a. The hydrogen or other appropriate gas is partially diffused upon entering plenum 31a and is forced into a vertical channel 31c formed in second ring plate 25 and having an inner diameter of approximately 0.04 inches. The gas enters a first chamber 31d, passes through a horizontal channel 31e, and enters a second chamber 31f. The gas is forced from second chamber 31f into reaction chamber 34a via a vertical gap 31g between ring plate 24 and dish 32. Note that the precise dimensions of each of elements 31a–31g may vary depending upon desired process gas flow characteristics.

Figure 8:
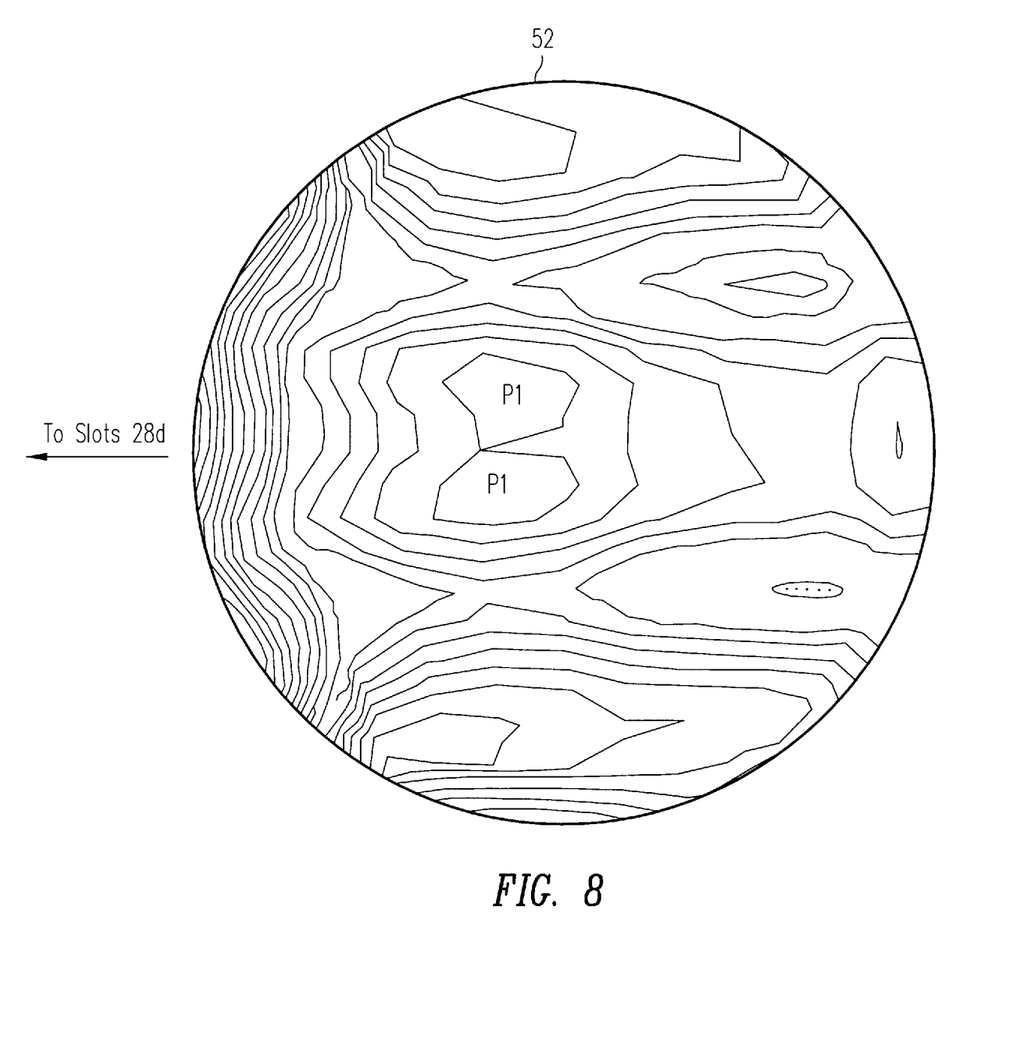
FIGS. 8 and 9 illustrate calculated deposition rates as a function of position on a wafer processed in accordance with the present embodiments.
Figure 9:
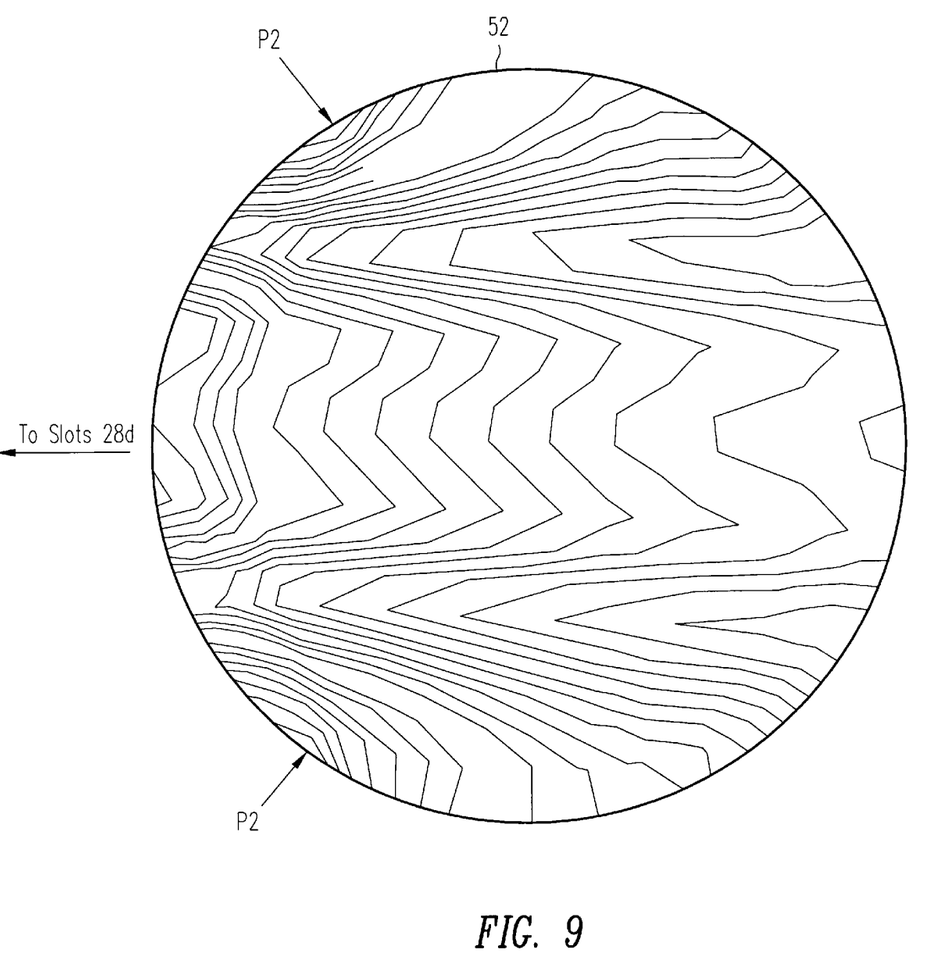

The flow of hydrogen or other appropriate gas interposed between the flow of reactant gases and dish 32 causes the flow of process gases from slots 28d to "turn over", as shown in FIG. 7, so as to flow through reaction chamber 34a parallel to the top surface of wafer 52, where the gas flow of process gases is indicated in solid lines while the gas flow of hydrogen (or other appropriate gas) is indicated in dashed lines. Thus, the process gases enter reaction chamber 34a at some predetermined angle and turn over so as to result in a maximum deposition on wafer 52 at point P1. The process gas flow then evens out into a substantially horizontal gas flow across the top surface of wafer 52. This maximum deposition point P1 may be moved relative to the surface of wafer 52 by adjusting the flow rate of the hydrogen or other appropriate gas emitted from gap 31g, where increasing the flow rate of the hydrogen (or other appropriate gas) results in the maximum deposition point P1 being moved further away from slots 28d. The deposition pattern may also be controlled by changing the angle of slots 28d. By way of example, FIGS. 8 and 9 illustrate the calculated deposition rate of the process gases as a function of position on wafer 52 under different operating conditions. In FIG. 8, hydrogen gas flows into reaction chamber 34a from gap 31g at a rate of approximately 10 L/min. The maximum deposition occurs in the two adjacent zones P1 in the center of wafer 52, where the deposition rate decreases as one moves from the inner portions of wafer 52 to the periphery of wafer 52. In FIG. 9, hydrogen gas flows into reaction chamber 34a from gap 31g at a rate of approximately 70 L/min. In this case, maximum deposition occurs in zones P2 and generally decreases as one moves across wafer 52 away from slots 28d. Note that the difference between the deposition patterns shown in FIGS. 8 and 9 is due to the difference in flow rates of the hydrogen gas, where increasing the flow rate of the hydrogen gas moves the recirculation towards slots 28d.

The compact gas injection system described above allows reactant gases to be evenly distributed close to the surface of wafer 52 without requiring a long entry channel in reaction chamber 34a, thereby allowing reaction chamber 34a to be of a more compact size and without adversely affecting desired gas flow characteristics. Also note that none of the above elements that facilitate gas flow into reaction chamber 34a protrude into heated portions of reaction chamber 34a where film deposition may occur, thereby preventing unwanted film deposition thereon. Further, the flow of hydrogen gas into reaction chamber 34a from injection duct 31 minimizes unwanted deposition on interior surfaces of dish 32. In preferred embodiments, gas flow rates are controlled so that the location of the maximum deposition rate, e.g. zones P1 or P2, counters any reactant depletion effect on wafer 52. In this manner, the rotation of wafer 52 may result in uniform deposition rates across the surface of wafer 52.

This gas injection system is in masked contrast to conventional CVD reactors such as those available from Applied Material and ASM in which the process gases are introduced in a horizontal flow pattern from the side of the chamber. Such conventional systems therefore require a long entry channel to achieve a uniform gas flow distribution across the chamber. Further, the long entry channel in these systems is typically within the heated portion of the chamber, thereby resulting in additional unwanted deposition upon interior surfaces of the chamber. Present embodiments, on the other hand, allow for process gases to enter reaction chamber 34a at some predetermined angle. Dish 32, together with the flow of hydrogen or appropriate gas from gap 31f, redirects the process gas flow to substantially horizontal. In this manner, a uniform flow of reactant gases across the surface of wafer 52 is ensured while advantageously minimizing the entry length.

During processing, the second motor causes wafer 52 to rotate, usually at speeds between 10 and 40 rpm. Referring back to FIGS. 2, 5, and 6, reactant gases are removed from reaction chamber 34a by flowing into a plurality of slots 30b which are connected to three exhaust plenums 30a. Each of exhaust plenums 30a is connected to an associated exhaust tube 30. Of course, in other embodiments reactor 10 may employ different exhaust mechanisms, including employing a greater or fewer number of exhaust plenums 30a. The remaining portion of chamber 34 which lies substantially below housing 42 may be purged of reactant gases leaking thereto from reaction chamber 34a using for instance Hydrogen or HCl gas. Hydrogen is compatible with suitable reactant gases and HCl is effective in removing reactant gas depositions from areas of chamber 34 lying substantially underneath housing 42.

Reactor 10 processes wafers at temperatures which may exceed approximately 1100° C. Applicants have determined that in order to avoid slip when removing wafer 52 from reactor 10, the wafer 52 should be cooled in a controlled and uniform manner to between approximately 750°–950° C. before the mechanical arm (not shown) removes wafer 52 through openings 14c and 22a. Since the throughput of reactor 10 is affected by the time required to cool wafer 52 from approximately 1100° C. or higher to approximately 800° C., it is advantageous to cool wafer 52 as quickly as possible in a uniform manner.

Immediately after processing wafer 52 in reaction chamber 34a, dish 32, wafer 52 and susceptor 50 are at approximately the same temperature, i.e., the reaction temperature. Power applied to coils 36 is maintained such that the temperature of dish 32 remains at the reaction temperature. The first and second drive motors are activated to lower housing 42 and susceptor 50, respectively, towards quartz plate 20 as shown in FIG. 1. As housing 42 and susceptor 50 are lowered away from dish 32, wafer 52 begins to cool. Since the outer portions of wafer 52 radiate heat at greater rates than do inner portions of wafer 52, power levels applied to the three independently controllable concentric zones of coils 44 are manipulated to compensate for this non-uniform heat loss by causing susceptor 50 to generate more heat from its outer portions than from its inner portions, thereby facilitating a uniform cooling of wafer 52. As the temperature of wafer 52 approaches approximately 800° C., slip problems become much less significant. As susceptor 50 nears the bottom of chamber 34, power to coils 44 is reduced, and susceptor 50 is brought into intimate contact with silicon carbide layer 46 of housing 42. Housing 42, as shown in FIG. 1, has formed therein three holes (not shown) into which pins 54 slide as susceptor 50 is brought into intimate contact with housing 42 so that wafer 52 rests on susceptor 50 while susceptor 50 is in intimate contact with layer 46.

During this cooling process, heat is conductively transferred from wafer 52 to susceptor 50, which in turn conductively transfers heat to layer 46 of housing 42. Layer 46 disperses heat therefrom to water circulating within coils 44. In this manner, wafer 52 may be cooled from a reaction temperature of approximately 1100° C. to approximately 800° C. in less than 1 minute. Conventional control algorithms may be employed to ensure that power provided to each of the zones of coils 36 and 44 is managed in a manner so as to result in raising and lowering the temperature of wafer 52 in a uniform manner, maintaining wafer 52 at a constant and uniform temperature during processing, and cooling wafer 52 in a uniform manner.

When the temperature of wafer 52 reaches approximately 800° C., susceptor 50 is raised a sufficient distance so as to engage and lift pins 54 out of their associated holes formed in housing 42. Susceptor 50 is then rotated so that pins 54 are no longer aligned with their associated holes formed in housing 42 and then lowered into intimate contact with layer 46. The lower ends of pins 54 engage the top surface of layer 46 of housing 42 and thereby lift wafer 52 off susceptor 50, as shown in FIG. 1. The temperature of susceptor 50 is not allowed to fall below approximately 800° C., and dish 32 is maintained at the reaction temperature even when reloading wafers. By maintaining internal components of reactor 10 at predetermined minimum temperatures, the amount of heat required to bring these components back up to the reaction temperature is advantageously minimized, thereby saving valuable time and energy.

In preferred embodiments, wafers to be processed in reactor 10 are first processed in a pre-clean chamber (not shown). The native oxide on the surface of the wafer may be removed in the pre-clean chamber in less than approximately one minute. In some embodiments, this pre-clean chamber is configured to feed two of reactors 10. The pre-clean chamber may operate at lower temperatures so as to minimize the thermal budget associated therewith. After cleaning, the wafers are then transferred from the pre-clean chamber to one of reactors 10 via an isolated transfer chamber (not shown) by a robotic arm (not shown).

This separate pre-cleaning chamber structure is in marked contrast to conventional techniques in which the process chamber of the CVD reactor is used for both cleaning the native oxide off the wafer and for wafer processing i.e. the deposition of films onto the wafer. In cleaning the wafer in such conventional systems, the chamber and wafer are brought to a high temperature such as for instance 1160° or higher. Hydrogen gas is pumped into the chamber and reacts with the native oxide on the wafer surface and thereby removes the native oxide. The temperature of the chamber is then lowered to a desired processing temperature.

By providing a separate pre-cleaning chamber, embodiments in accordance with the present invention increase throughput since the process chamber does not have to double as a pre-cleaning chamber and may thus be continuously employed for processing wafers. Further, by performing pre-cleaning functions at temperatures substantially lower than 1160° C., embodiments in accordance with the present invention reduce the associated thermal budget. Of course, it should be noted that the pre-cleaning chamber is separate from the process chamber in present embodiments and is thus not used for film deposition. Therefore, the pre-cleaning chamber may be optimized for cleaning wafers.

After pre-cleaning, the mechanical arm inserts the wafer into reactor 10 through openings 14c and 22a and places the wafer in a radially-centered position with respect to susceptor 50 resting on pins 54. In this position, wafer 52 is approximately ¼ inch above the surface of susceptor 50. Recall that the temperature of susceptor 50 is approximately 800° C. from previous process runs. Thus, the wafer should experience a symmetrical heating pattern emanating from susceptor 50. In order to minimize slip, wafer 52 should be inserted into reactor 10 and into its appropriate position on pins 54 in less than approximately 1.5 seconds. Susceptor 50 is then raised so as to lift wafer 52 off pins 54, as described earlier, thereby quickly bringing the temperature of wafer 52 to approximately 800° C. As housing 42 and susceptor 50 are elevated towards dish 32, power levels applied to coils 44 and thus the RF energy emitted thereby are manipulated such that the temperature of wafer 52 is brought to the reaction temperature in a uniform manner.

The dual-chamber structure of reactor 10 allows for superior performance over conventional CVD reactors that employ a single chamber which serves as both the pressure vessel and the reaction chamber. In such conventional CVD reactors, the chamber must be designed in such a manner so as to achieve not only a low pressure environment capable of withstanding the external atmospheric pressure but also an ideal flow of reactant gases. Since, as discussed earlier, the design considerations necessary to sustaining a low pressure environment are not necessarily consistent with those necessary for optimizing reactant gas flow, the design of such single chamber CVD reactors undesirably requires compromising design considerations of both. That is, while a flat shaped chamber (i.e., one in which the dimension of the chamber perpendicular to the surface of the wafer is minimal) having a non-convoluted surface is desirable to optimize reactant gas flow, such flat structures are incapable of sustaining a low pressure environment without significant structural reinforcement. On the other hand, the ability to sustain low pressure environments compels a fuller globe-shaped chamber which, in turn, undesirably results in a wider flow channel for reactant gases. As noted above, a wide flow channel may adversely affect the reactant gas flow velocities and concentration gradients across the wafer. In sum, in addition to suffering from warm wall problems discussed above, the design of conventional single-chamber CVD reactors cannot be simultaneously optimized for both low pressure results and uniform reactant gas flow.

Thus, reactor 10 employs two separate chambers each of which is specifically designed for its intended purpose. The design of bell jar 16 is optimized to sustain a very low pressure therein without adversely influencing gas flow characteristics within reaction chamber 34a. Bell jar 16 is a domed-type structure as shown in FIGS. 1 and 2 which maximizes structural strength and thereby allows low pressures to be sustained therein. In preferred embodiments, bell jar 16 is approximately 10–20 mm thick and is capable of sustaining very low pressures, e.g., below 1E–8 Torr.

The ability to sustain low pressures improves the performance of reactor 10. Pattern shift and distortion are greatly reduced at low pressures. Further, when processing a wafer at low pressures, materials may be deposited thereon at lower temperatures which, in turn, helps prevent wafer slip, i.e., breaks along the lattice of crystalline silicon wafer, and lowers the associated thermal budget.

Reaction chamber 34a is contained entirely within and is at the same pressure as the pressure vessel and thus does not have to withstand a large pressure difference between its interior and exterior. Accordingly, reaction chamber 34a does not have to be of a domed shape but may rather be of a geometry which allows for optimum gas flow across wafer 52. Accordingly, when wafer 52 is elevated to the processing position as described above and shown in FIG. 2, reaction chamber 34a is of a shape similar to that of a thin pancake and, by having a thin flow channel, advantageously allows for a maximum gas flow velocity through reaction chamber 34a.

Applicants have determined that reaction chamber 34a should be of a height of approximately ⅜ of an inch or less, as measured between wafer 52 and dish 32, in order to achieve an ideal reactant gas flow across wafer 52. Reaction chambers having heights greater than approximately ⅜ of an inch require a greater gas flow to maintain desirable gas velocity and may have slower deposition rates.

Isolating the process gases in reaction chamber 34a from the pressure vessel results in certain advantages. First, reactant gases used in the formation of various layers on wafer 52 are prevented from entering volume 12 and, thus, do not deposit on the walls of bell jar 16. As a result, it is not necessary to frequently clean the inner walls of bell jar 16, thereby saving time and reducing operating expenses. Further, since reactant gases do not deposit on the walls of bell jar 16, heat transfer efficiency through the walls of bell jar 16 in those embodiments which employ heating lamps rather than induction coils 36 is not adversely affected during wafer processing.

Second, the isolation of reaction chamber 34a from the pressure vessel allows reactor 10 to form not only thin epitaxial films but also thick epitaxial films on wafer 52. As mentioned above, reactant gases undesirably deposit on the walls of conventional radiantly warm wall CVD chambers during wafer processing. When depositing films greater than 100 microns thick on a wafer, significant deposition can occur on the warm walls. Silicon deposited on the quartz walls can absorb heat generated from radiant heat sources. This absorbed heat further increases the temperature of the quartz walls and thereby increases the rate at which silicon deposits on the quartz walls. Deposition rates on the reactor walls therefore increase while the wafer temperature, and thus the local rate of deposition on the wafer, decreases. In contrast, heat transfer from dish 32 depends primarily upon the emissivity of dish 32, not upon the thickness of any layer deposited thereon. The thickness of any deposition coating on the inner surface of dish 32 therefore does not influence the heat transfer therethrough. Hence, even a 100 micron thick layer deposited on the inner surface of dish 32 would not significantly affect the delivery of heat energy through induction coils 36 to wafer 52 therethrough.

Positioning wafer 52 within a black body cavity (reaction chamber 34a) during processing is also advantageous in allowing for more accurate temperature measurements of wafer 52. Since wafer 52 quickly reaches thermal equilibrium with the walls of reaction chamber 34a, the temperature of wafer 52 may be determined by measuring the temperature of the exterior of the walls of reaction chamber 34a. Recall that the dual-chamber design of reactor 10 prevents unwanted deposition of process gases on surfaces which form volume 12. Thus, unlike the emissivity of wafer 52, the emissivity of the exterior of the walls of reaction chamber 34a is predictable during processing of wafer 52. In this manner, the temperature of wafer 52 may be determined independently of its changing emissivity, thereby allowing the temperature of wafer 52 to be determined with increased precision. This is in marked contrast to those conventional CVD reactors which attempt to directly measure the temperature of wafer 52.

Further, the simple shape of chamber 34a, as compared to other reaction chambers commonly used in other CVD reactors, allows for a quick and easy cleaning of chamber 34a. Indeed, Applicants have found that chamber 34a may be cleaned in less than 30 seconds. In contrast, it typically takes as much as 3 minutes to clean the chamber of a typical radiantly heated CVD reactor.

Note that although described above and illustrated in the drawings as employing RF heating coils, reactor 10 may in other embodiments employ other heating systems such as a radiant heating system while still realizing the advantages described above.

Figure 10:
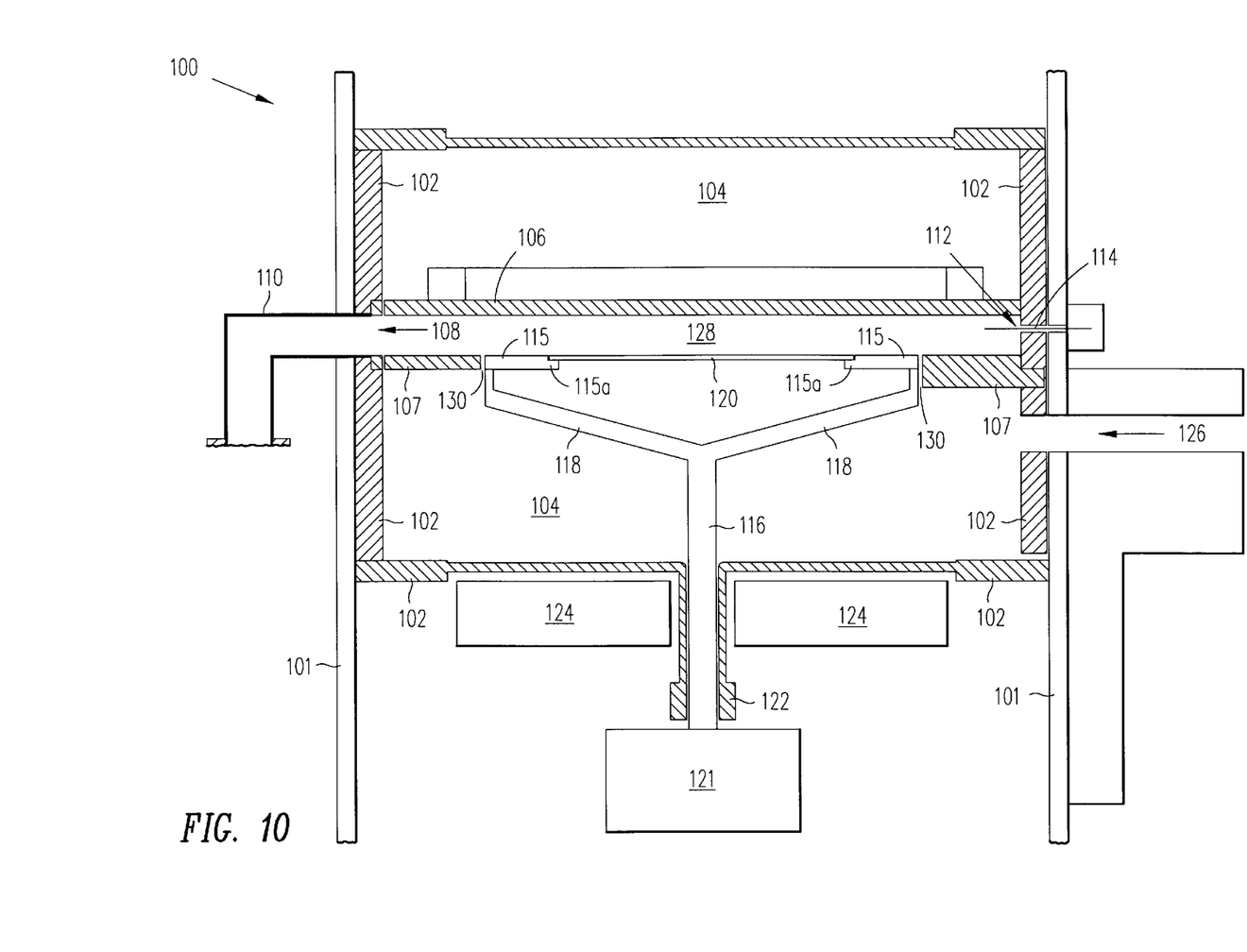
FIG. 10 is a cross sectional view along an axis of a cylindrical reactor in accordance with another embodiment of the present invention.
Figure 11:
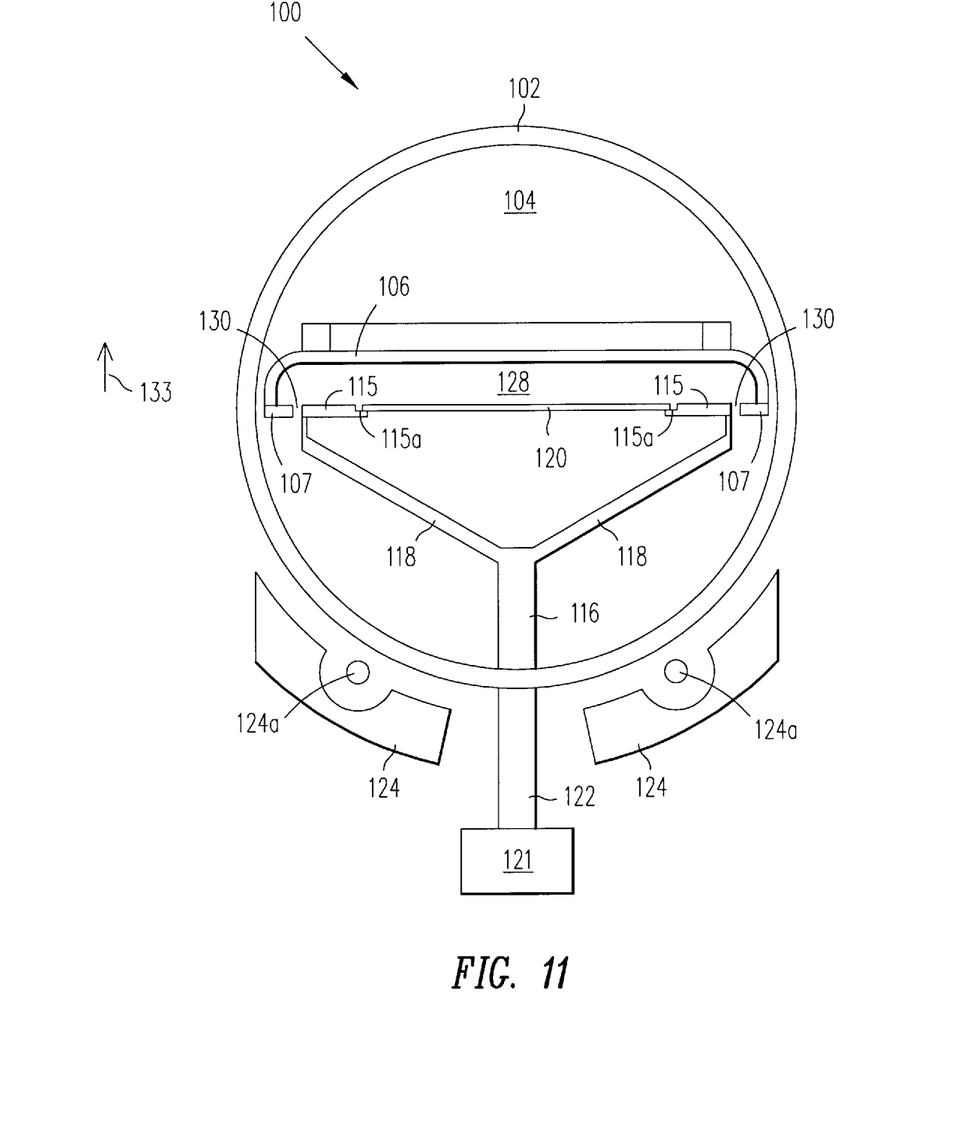
FIG. 11 is a cross-sectional view along a diameter of the reactor of FIG. 10.

Another embodiment in accordance with the present invention is shown in FIGS. 10 and 11. Reactor 100 includes a stainless steel frame 101 (shown only in FIG. 3 for simplicity) supporting a cylindrical clear quartz pressure vessel 102 that contains a low pressure environment 104. Within pressure environment 104 is positioned an inverted top plate 106 and a bottom plate 107 which is supported on a periphery thereof by body 102. Top plate 106 and bottom plate 107 are preferably either graphite or silicon carbide. Aligned openings 108 formed in respective vessel 102 and top plate 106 allow one or more exhaust tubes 110 to pass therethrough, while aligned openings 112 formed in respective body 102 and top plate 106 allow one or more process gas injection tubes 114 to pass therethrough.

A graphite support which includes a shaft 116 connected to three arms 118 is provided to position and rotate a susceptor 115. Susceptor 115 preferably made of graphite is mounted onto arms 118 and supports a wafer 120. Susceptor 115 may have a recessed portion 115a and an open center, as shown in FIG. 10, or may be of a construction similar to that of susceptor 50 shown in FIGS. 3A and 3B. In either embodiment, susceptor 115 properly centers a wafer 120 within reactor 100 and also minimizes variations in the transfer of heat to wafer 120. Shaft 116 passes through an opening in vessel 102 and is operatively coupled in a conventional manner to a drive motor 121 via a casing 122 affixed to vessel 102, as shown in FIG. 11. Drive motor 121 may be of any well known suitable design capable of raising and lowering support 116 within vessel 102 and capable of rotating support 116 (and thus wafer 120) to speeds appropriate for CVD processing.

In a preferred embodiment, a layer of quartz is provided on an inner surface of vessel 102 to insulate stainless steel frame 101 from heat energy emitted from lamp housings 124 positioned underneath vessel 102. In one embodiment, lamp housings 124 each include a plurality of arc-type argon lamps 124a. Lamps 124a do not have filaments and may thus be maintained in working condition more cheaply than can filament type lamps. A plurality of heat lamps (not shown) arranged in three independently controlled zones about the periphery of vessel 102 in a well known manner indirectly heat wafer 120 via dish 106. These heat lamps arranged on the periphery of vessel 102, together with lamp housings 124, radiantly heat top plate 106, bottom plate 107, and susceptor 115 which, by approximating a black body cavity, heat wafer 120 in a uniform manner.

Wafer 120 is processed in reactor 100 as follows. Initially, support 116 is in a loading position (not shown) such that wafer 120 may be inserted into vessel 102 through an opening 126 formed in vessel 102 via a robotic arm (which is of a well known design and is thus not shown for simplicity). Drive motor 121 is operated so as to raise support 116 and wafer 120 into a processing position, as shown in FIG. 11. When in the processing position, top plate 106, bottom plate 107, wafer 120, and susceptor 115 form within pressure vessel 102 a reaction chamber 128 which, as mentioned above, approximates a black body cavity.

During processing of wafer 120, reactant gases are injected into reaction chamber 128 through one or more intake tubes 114 via any well known gas injector device. Reaction chamber 128, like reaction chamber 34a of reactor 10 (see FIGS. 1 and 2), has a narrow height dimension as defined by arrow 133 to ensure optimum flow of reactant gases within reaction chamber 128.

Power is applied to lamps 124a to indirectly heat wafer 120 to a desired reaction temperature. The black body cavity approximated by reaction chamber 128 allows for excellent temperature uniformity across the surface of wafer 120 using these lamps. In some embodiments, lamps 124a may be arranged into multiple independently controlled heating zones. In one embodiment, each of lamps 124a is rated at 150–200 kW so as to heat an area much larger than the surface area of wafer 120. In this manner, the entirety of wafer 120 will be within the "sweet spot" of the heated zone such that edge effects will be of minimum influence at the outer edge of wafer 120.

During processing, hydrogen gas or any other suitable gas is forced through spacing 130 into reaction chamber 128, using conventional means, to prevent any reactant gases from escaping reaction chamber 128 and flowing to areas underneath susceptor 115.

Note that reaction chamber 128 is entirely contained within, and separate from, volume 104 sustained by pressure vessel 102 such that reactant gases flowing within reaction chamber 128 during processing of wafer 120 will not come into contact with vessel 102. Thus, by providing separate reaction 128 and pressure 104 chambers, reactor 100 achieves advantages similar to those discussed above with respect to reactor 10. Of particular importance is that pressure vessel 102 and reaction chamber 128 may be independently designed to optimize their intended functions. Thus, vessel 102 may be optimized forstrength to sustain a low pressure, while reaction chamber 128 may be designed to optimize the flow characteristics of reactant gases used to form layers on wafer 120. In this manner, reactor 100 achieves a superior performance over prior art reactors having a single chamber which must not only sustain low pressures but must also optimize gas flow characteristics. Further, reactant gases are prevented from contacting chamber wall 102 and thus do not deposit thereon. Preventing film deposition upon the walls of pressure vessel 102 results in savings in cleaning time, thereby increasing wafer throughput.

While particular embodiments of the present invention have been shown and described, it will be obvious to those skilled in the art that various changes and modifications may be made without departing from this invention in its broader aspects and, therefore, the appended claims encompass all such changes and modifications as fall within the true spirit and scope of this invention.

What is claimed is:

1. A CVD reactor comprising:
   a pressure chamber for maintaining a reduced pressure environment;
   a reaction chamber contained entirely within said pressure chamber, said reaction chamber comprising a susceptor upon which rests a wafer to be processed therein using one or more process gases, the interior of said reaction chamber being substantially isolated from said pressure chamber such that said process gases present in said reaction chamber do not contact a surface of said pressure chamber; and
   a first plurality of induction coils positioned on an external periphery of said pressure chamber, said induction coils generating an RF field which inductively couples with a portion of said reaction chamber which in turn heats said wafer in said reaction chamber, wherein said first plurality of induction coils are arranged in two or more independently controllable concentric zones.

2. A CVD reactor comprising:
   a pressure chamber for maintaining a reduced pressure environment;
   a reaction chamber contained entirely within said pressure chamber, said reaction chamber comprising a susceptor upon which rests a wafer to be processed therein using one or more process gases, the interior of said reaction chamber being substantially isolated from said pressure chamber such that said process gases present in said reaction chamber do not contact a surface of said pressure chamber; and
   a first plurality of induction coils positioned on an external periphery of said pressure chamber, said induction coils generating an RF field which inductively couples with a portion of said reaction chamber which in turn heats said wafer in said reaction chamber, wherein said portion of said reaction chamber comprises a dish structure positioned immediately above said wafer in said reaction chamber, said dish structure heating said from above said wafer.

3. The reactor of claim 2, further comprising a gas injection system for injecting said one or more process gases into said chamber, said gas injection system comprising:
   one or more first feed tubes; and
   one or more second feed tubes;
   wherein said one or more process gases are injected into said reaction chamber from each of said first feed tubes, and a first gas is injected into said reaction chamber via said second feed tubes, the flow of said first gas from said second feed tubes directing the flow of said process gases parallel to a top surface of said wafer while shielding said dish from said flow of said process gases so as to prevent deposition of said process gases on said dish.

4. The reactor of claim 2, wherein said dish structure and said susceptor form said reaction chamber and approximate a black body cavity within which said wafer rests and is heated from all sides.

5. The reactor of claim 4, wherein said dish structure is comprised of graphite.

6. The reactor of claim 4, further comprising first and second aligned openings formed in said respective pressure chamber and said reaction chamber through which said wafer may be inserted into and removed from said reactor, said first and second openings being proximate to a bottom surface of said reactor.

7. The reactor of claim 6, wherein said black body cavity is proximate to a top surface of said reactor.

8. A CVD reactor comprising:
   a pressure chamber for maintaining a reduced pressure environment;
   a reaction chamber contained entirely within said pressure chamber, said reaction chamber comprising a susceptor upon which rests a wafer to be processed therein using one or more process gases, the interior of said reaction chamber being substantially isolated from said pressure chamber such that said process gases present in said reaction chamber do not contact a surface of said pressure chamber;
   a first plurality of induction coils positioned on an external periphery of said pressure chamber, said induction coils generating an RF field which inductively couples with a portion of said reaction chamber which in turn heats said wafer in said reaction chamber;
   a second plurality of induction coils positioned immediately below said wafer, said second plurality of induction coils generating an RF field which inductively couples with and thus heats said susceptor which in turn heats said wafer from below said wafer.

9. The reactor of claim 8, further comprising:

a controller;

a first group of sensors positioned above said wafer and coupled to said controller, said first group of sensors providing to said controller information indicative of the temperature of portions of said reaction chamber immediately above said wafer; and a second group of sensors positioned below said wafer and coupled to said controller, said second group of sensors providing to said controller information indicative of the temperature of portions of said reaction chamber immediately below said wafer;

wherein said controller adjusts the RF field generated by said first plurality of induction coils in response to said information provided by said first group of sensors and adjusts the RF field generated by said second plurality of induction coils in response to said information provided by said second group of sensors.

10. The reactor of claim 9, wherein said sensors comprises infrared sensors.

11. A CVD reactor comprising:

a pressure chamber for maintaining a reduced pressure environment;

a reaction chamber contained entirely within said pressure chamber, said reaction chamber comprising a susceptor upon which rests a wafer to be processed therein using one or more process gases, the interior of said reaction chamber being substantially isolated from said pressure chamber such that said process gases present in said reaction chamber do not contact a surface of said pressure chamber;

a dish formed as part of said reaction chamber, said dish, said susceptor, and said wafer approximating a black body cavity; and a first plurality of radiant energy sources positioned on an external periphery of said pressure chamber, said radiant energy sources radiantly heating said dish which in turn heats said wafer.

12. The reactor of claim 11, further comprising a second plurality of radiant energy sources positioned beneath said wafer, said second plurality of radiant energy sources indirectly heating said wafer from below and from above said wafer.

13. The reactor of claim 12, wherein each of said first and second plurality of radiant energy sources is arranged in two or more independently controlled concentric zones.

* * * * *